United States Patent
Higuchi

(10) Patent No.: US 6,624,430 B2
(45) Date of Patent: Sep. 23, 2003

(54) METHOD OF MEASURING AND CALIBRATING INCLINATION OF ELECTRON BEAM IN ELECTRON BEAM PROXIMITY EXPOSURE APPARATUS, AND ELECTRON BEAM PROXIMITY EXPOSURE APPARATUS

(75) Inventor: Akira Higuchi, Machida (JP)

(73) Assignee: Leepl Corporation, Machida (JP)

( * ) Notice: Subject to any disclaimer, the term of this patent is extended or adjusted under 35 U.S.C. 154(b) by 0 days.

(21) Appl. No.: 10/152,343

(22) Filed: May 22, 2002

(65) Prior Publication Data

US 2002/0179857 A1 Dec. 5, 2002

(30) Foreign Application Priority Data

May 25, 2001 (JP) ..................................... 2001-157606

(51) Int. Cl.$^7$ .............................. G21K 5/10; H01J 37/08
(52) U.S. Cl. ................... 250/492.23; 430/5; 250/491.1
(58) Field of Search ........................ 250/492.2, 492.23, 250/548, 491.1; 430/5; 356/900

(56) References Cited

U.S. PATENT DOCUMENTS

| | | | |
|---|---|---|---|
| 5,557,314 A | * | 9/1996 | Okamoto et al. ........... 347/230 |
| 5,757,409 A | * | 5/1998 | Okamoto et al. ........... 347/230 |
| 5,831,272 A | | 11/1998 | Utsumi |
| 6,242,754 B1 | * | 6/2001 | Shiraishi ..................... 250/548 |
| 6,400,441 B1 | * | 6/2002 | Nishi et al. .................. 355/53 |
| 6,444,374 B1 | * | 9/2002 | Shimazu et al. .............. 430/5 |
| 2002/0070354 A1 | * | 6/2002 | Shimazu et al. ......... 250/492.2 |
| 2003/0090661 A1 | * | 5/2003 | Kobayashi .................. 356/400 |

FOREIGN PATENT DOCUMENTS

JP  2000-356511  12/2000

* cited by examiner

*Primary Examiner*—Jack Berman
*Assistant Examiner*—Johnnie Smith, II
(74) *Attorney, Agent, or Firm*—Nixon Peabody LLP; David S. Safran

(57) ABSTRACT

A calibration mask having a plurality of marks previously formed thereon is loaded, and a deflector is used to control deflection of electron beams so that the electron beams are incident on a mark of the calibration mask. The electron beams, having passed through the mark, impinge on a first Faraday cup having a first mark and on a second Faraday cup having a second mark. Then, positional coordinates on an XY stage are detected when electrical quantities detected by the Faraday cups are largest. The positional coordinates on the above mentioned XY stage are detected for each of the marks of the calibration mask. Then, according to the positional coordinates on the XY stage detected in this manner and a difference in height between the marks, the inclination of the electron beams is calculated for the position input to each mark of the calibration mask. Thus, the inclination of electron beams can be accurately measured.

7 Claims, 11 Drawing Sheets

METHOD OF MEASURING AND CALIBRATING INCLINATION OF ELECTRON BEAM IN ELECTRON BEAM PROXIMITY EXPOSURE APPARATUS, AND ELECTRON BEAM PROXIMITY EXPOSURE APPARATUS

BACKGROUND OF THE INVENTION

1. Field of the Invention

The present invention relates to methods of measuring and calibrating inclination of an electron beam in an electron beam proximity exposure apparatus, as well as an electron beam proximity exposure apparatus.

2. Description of the Related Art

An electron beam proximity exposure apparatus of this kind has conventionally been disclosed in U.S. Pat. No. 5,831,272 (corresponding to Japanese Patent No. 2951947).

FIG. 11 shows a basic configuration of this electron beam proximity exposure apparatus. This electron beam proximity exposure apparatus 10 is composed of an electron gun 12 mainly including an electron beam source 14 which generates electron beams 15, a lens 16 which makes the electron beams 15 parallel with each other, and a shaping aperture 18; a scanning device 20 which includes main deflectors 22 and 24 and sub-deflectors 26 and 28 to cause the electron beams to scan a mask while remaining parallel with an optical axis; a mask 30; an electrostatic chuck 50; and an XY stage.

The mask 30 is arranged in proximity to a wafer 40 attracted to the electrostatic chuck 60 so that the gap between the mask 30 and the wafer 40 is, for example, 50 μm. In this state, when emitted perpendicularly to the mask 30, electron beams pass through the mask pattern on the mask 30 and then fall on a resist layer 42 on the wafer.

The main deflectors 22 and 24 of the scanning device 20 controls deflection of the electron beams 15 so that the electron beams scan the entire surface of the mask 30 as shown in FIG. 12. This causes the mask pattern of the mask 30 to be transferred to the resist layer 42 on the wafer 40 on an equal scale.

Further, the sub-deflectors 26 and 28 of the scanning device 20 controls an angle at which the electron beams are incident on the mask pattern so as to correct distortion of the mask (inclination correction). Now, when the angle at which the electron beams 15 are incident on the mask 30 is defined as α and the gap between the mask 30 and the wafer 40 is defined as G as shown in FIG. 13, the amount δ of deviation of a mask pattern transferred position resulting from the incident angle α is expressed by the following equation:

$$\delta = G \cdot \tan \alpha.$$

In FIG. 13, the mask pattern is transferred to a position deviating from the regular one by the amount δ. Accordingly, if the mask 30 is distorted, for example, as shown in FIG. 14(A), the mask pattern is transferred without any distortion as shown in FIG. 14(B) by controlling the inclination of the electron beams according to the distortion of the mask observed at a position scanned by the electron beams.

The XY stage 60 moves the wafer 40 attracted to the electrostatic chuck 50, in two horizontally orthogonal axial directions. Each time the equal-scale transfer of the mask pattern is completed, the XY stage 60 moves the wafer 40 a predetermined distance to enable a plurality of mask patterns to be transferred to the single wafer 40.

If the main deflectors 22 and 24 control deflection of the electron beams 15 so that the electron beams scan the entire surface of the mask 30, then the electron beams must scan the mask while remaining parallel with the optical axis as shown in FIG. 11. Thus, the inclination of the electron beams 15 must be accurately measured according to the position scanned by the electron beams 15.

Further, if the sub-deflectors 26 and 28 control the angle at which the electron beams 15 are incident on the mask pattern, the relationship between a voltage applied to the sub-deflectors 26 and 28 and the angle at which the electron beams 15 are incident on the mask pattern must be previously determined.

SUMMARY OF THE INVENTION

The present invention is achieved in view of these points, and it is an object thereof to provide a method of measuring inclination of an electron beam in an electron beam proximity exposure apparatus, the method enabling the inclination of the electron beam to be accurately measured and enabling determination of the relationship between a voltage applied to sub-deflectors and the angle at which the electron beam is incident on a mask pattern.

It is another object of the present invention to provide a method of calibrating inclination of an electron beam in an electron beam proximity exposure apparatus as well as an electron beam proximity exposure apparatus wherein the electron beam can scan a mask while remaining parallel with an optical axis when the electron beam scans the entire surface of the mask.

To attain the above objects, the present invention is directed to a method of measuring inclination of an electron beam in an electron beam proximity exposure apparatus which transfers a mask pattern formed on a mask to a resist layer on a wafer, wherein the electron beam proximity exposure apparatus comprises: an electron gun that emits the electron beam with a predetermined sectional shape; the mask arranged in proximity to the wafer; a deflector that controls deflection of the electron beam emitted by the electron gun so that the electron beam scans an entire surface of the mask; a calibration mask having a plurality of marks previously formed thereon; a first electron beam detecting device which has a first mark and which converts the electron beam passing through the first mark into an electrical quantity; a second electron beam detecting device which has a second mark located above the first mark and below the calibration mask and which converts the electron beam passing through the second mark into an electrical quantity; and a moving device which moves the first and second electron beam detecting devices on an xy plane which is orthogonal to an optical axis of the electron beam, the method comprising the steps of: (a) loading the calibration mask and using the deflector to control deflection of the electron beam so that the electron beam impinges on an arbitrary mark of the calibration mask; (b) detecting a position of the first electron beam detecting device after movement when the electron beam, having passed through the mark of the calibration mask, passes through a first mark of the first electron beam detecting device to make the electrical quantity detected by the first electron beam detecting device largest; (c) detecting a position of the second electron beam detecting device after movement when the electron beam, having passed through the mark of the calibration mask, passes through a second mark of the second electron beam detecting device to make the electrical quantity detected by the second electron beam detecting device largest; (d) calculating the inclination of the electron beam observed when the electron beam is deflected so as to impinge on the arbitrary mark of the calibration mask according to positions of the first electron beam detecting device in x and y directions after movement, the positions being detected in the step (b), positions of the second electron beam detecting device in the x and y directions after movement, the positions being detected in the step (c), the amounts of positional difference between the first and second marks in the x and y directions, and a difference in height between the first and second marks; and (e) repeating the steps (a) to (d) for each mark of the calibration mask to determine the inclination of the incident electron beam for each mark.

According to the present invention, at the step (b), the position of the first electron beam detecting device after movement is detected when the mark of the calibration mask and the first mark are on the electron beam axis. Similarly, at the step (c), the position of the second electron beam detecting device after movement is detected when the mark of the calibration mask and the second mark are on the electron beam axis. Accordingly, when the amounts of positional difference between the first and second marks in the x and y directions are already known or detected, the inclination of the electron beam deflected so as to impinge on the mark of the calibration mask can be calculated from geometrical relations based on the positions of the first electron beam detecting device in the x and y directions after movement, the positions of the second electron beam detecting device in the x and y directions after movement, and the difference in height between the first and second marks. Likewise, the inclination of the electron beam can be calculated when the electron beam is deflected so as to impinge on another mark of the calibration mask.

Preferably, the amounts of positional difference between the first and second marks in the x and y directions are determined by: allowing the electron beam to impinge on a mark of the calibration mask located on an optical axis of the electron gun without deflecting the electron beam using the deflector; detecting the position of the first electron beam detecting device after movement when the electron beam, having passed through the mark of the calibration mask, passes through the first mark of the first electron beam detecting device to make the electrical quantity detected by the first electron beam detecting device largest; detecting the position of the second electron beam detecting device after movement when the electron beam, having passed through the mark of the calibration mask, passes through the second mark of the second electron beam detecting device to make the electrical quantity detected by the second electron beam detecting device largest; and determining the amount of deviation according to the detected position of the first electron beam detecting device in the x and y directions and the detected position of the second electron beam detecting device in the x and y directions.

The present invention is also directed to method of calibrating inclination of an electron beam in an electron beam proximity exposure apparatus, the method comprising the steps of: determining an inclination correction value for each mark formed on the calibration mask, the inclination correction value being used to zero the inclination of the electron beam determined by the above-described method of measuring inclination of the electron beam in the electron beam proximity exposure apparatus; creating an inclination correction table that stores correction values correspondingly to a position scanned by the electron beam; when the deflector is used to control deflection of the electron beam emitted by the electron gun so that the electron beam scans the entire surface of the mask, reading out a corresponding inclination correction value from the inclination correction table according to the position scanned by the electron beam and controlling the deflector according to the readout inclination correction value; and calibrating the electron beam so that the electron beam is parallel with the optical axis regardless of the position scanned by the electron beam.

According to the present invention, with the above-described method of measuring inclination of the electron beam, the inclination of the electron beam can be measured for each of the plurality of marks of the calibration mask (that is, the inclination according to the position scanned by the electron beam on the mask) when the electron beam passes through the mark. When the entire surface of the mask is scanned to expose the mask pattern to the electron beam to thereby transfer the pattern to the wafer, located in proximity to the mask pattern, the inclination of the electron beam is calibrated according to the correction table, which stores inclination correction values used to zero the inclination of the electron beam correspondingly to the position scanned thereby, so that the electron beam is parallel with the optical axis regardless of the position scanned thereby.

The present invention is also directed to a method of calibrating inclination of an electron beam in an electron beam proximity exposure apparatus which transfers a mask pattern formed on a mask to a resist layer on a wafer, wherein the electron beam proximity exposure apparatus comprises: an electron gun that emits the electron beam with a predetermined sectional shape; the mask arranged in proximity to the wafer; a main deflector which controls deflection of the electron beam emitted by the electron gun so that the electron beam scans an entire surface of the mask; a sub-deflector which controls the inclination of the electron beam impinging on the mask; an electron beam detecting device which has two marks arranged on an axis which is parallel with an optical axis of the electron gun, the marks being located at different heights, the electron beam detecting device converting the electron beam passing through the two marks into an electrical quantity; and a moving device which moves the electron beam detecting device to an arbitrary position scanned by the electron beam, the method comprising the steps of: (a) moving the electron beam detecting device to the arbitrary position scanned by the electron beam and using the main deflector to deflect the electron beam so that the electron beam impinges on the electron beam detecting device; (b) varying the inclination of the electron beam using a voltage applied to the sub-deflector and detecting the voltage applied when the electrical quantity detected by the electron beam detecting device is largest; (c) executing the steps (a) and (b) by varying the position of the electron beam detecting device and creating a correction table that stores the voltage applied to the sub-defector correspondingly to the position scanned by the electron beam; and (d) when the main deflector is used to control deflection of the electron beam emitted by the electron gun so that the electron beam scans the entire surface of the mask, reading out a corresponding voltage from the inclination correction table according to the position scanned by the electron beam, and applying the voltage to the sub-deflector, wherein calibration is executed so that the electron beam is parallel with the optical axis regardless of the position scanned by the electron beam.

According to the present invention, using the sub-deflector which can control the inclination of the electron beam entering the mask when the main deflector controls deflection of the electron beam so that the electron beam scans the entire surface of the mask, the inclination of the electron beam is calibrated so as to make the electron beam parallel with the optical axis regardless of the position scanned by the electron beam. The voltage applied to the sub-deflector at the time of calibrating the inclination of the electron beam corresponds to the one applied to the sub-deflector when the electrical quantity detected by the electron beam detecting means is largest (that is, when the electron beam is orthogonal to the mask surface) and stored in the correction table according to the position scanned by the electron beam and the stored voltage is used.

The present invention is also directed to a method of measuring inclination of an electron beam in an electron beam proximity exposure apparatus which transfers a mask pattern formed on a mask to a resist layer on a wafer, wherein the electron beam proximity exposure apparatus comprises: an electron gun that emits the electron beam with a predetermined sectional shape; the mask arranged in proximity to the wafer; a main deflector which controls deflection of the electron beam emitted by the electron gun so that the electron beam scans an entire surface of the mask; a sub-deflector which controls the inclination of the electron beam impinging on the mask; a calibration mask having a plurality of marks previously formed thereon; a first electron beam detecting device which has a first mark and which converts the electron beam passing through the first mark into an electrical quantity; a second electron beam detecting device which has a second mark located above the first mark and below the calibration mask and which converts the electron beam passing through the second mark into an electrical quantity; and a moving device which moves the first and second electron beam detecting devices on an xy plane which is orthogonal to an optical axis of the electron beam, the method comprising the steps of: (a) loading the calibration mask and using the main deflector to control deflection of the electron beam so that the electron beam impinges on an arbitrary mark of the calibration mask; (b) applying a predetermined voltage to the sub-deflector to incline the electron beam; (c) detecting a position of the first electron beam detecting device after movement when the electron beam, having passed through the mark of the calibration mask, passes through the first mark of the first electron beam detecting device to make the electrical quantity detected by the first electron beam detecting device largest; (d) detecting a position of the second electron beam detecting device after movement when the electron beam, having passed through the mark of the calibration mask, passes through the second mark of the second electron beam detecting device to make the electrical quantity detected by the second electron beam detecting device largest; (e) using the main deflector to deflect the electron beam so that the electron beam impinges on the arbitrary mark of the calibration mask, according to positions of the first electron beam detecting device in x and y directions after movement, the positions being detected in the step (c), positions of the second electron beam detecting device in the x and y directions after movement, the positions being detected in the step (d), and the amounts of positional difference between the first and second marks in the x and y directions, and calculating at least one of the inclination of the electron beam and the amount of deflection thereof observed when a predetermined voltage is applied to the sub-deflector; and (f) repeating the steps (a) to (d) for each mark of the calibration mask to determine for each mark relationship between the voltage applied to the sub-deflector and the at least one of the inclination of the electron beam and the amount of deflection thereof associated with the voltage.

According to the present invention, the inclination of electron beam incident on the mark of the calibration mask or the amount of deflection thereof is calculated when the predetermined voltage is applied to the sub-deflector. The inclination of the electron beam or the amount of deflection thereof is measured using a method similar to the above-described method. Likewise, the inclination of electron beam deflected so as to enter another mark of the calibration mask or the amount of deflection thereof is calculated when the predetermined voltage is applied to the sub-deflector. This enables, for each mark of the calibration mask (that is, for each scanned position on the mask), determination of the relationship between the voltage applied to the sub-deflector and the inclination of the electron beam or the amount of deflection thereof associated with this voltage. The thus determined relationship between the voltage applied to the sub-deflector and the inclination of the electron beam or the amount of deflection thereof is used to control deflection of the electron beam so that the electron beam has a desired inclination or deflection amount at an arbitrary scanned position on the mask.

The present invention is also directed to an electron beam proximity exposure apparatus which transfers a mask pattern formed on a transfer mask to a resist layer on a wafer, the electron beam proximity exposure apparatus comprising: an electron gun that emits an electron beam with a predetermined sectional shape; the transfer mask arranged in proximity to the wafer; a main deflector which controls deflection of the electron beam emitted by the electron gun so that the electron beam scans an entire surface of the transfer mask; a sub-deflector which controls inclination of the electron beam impinging on the transfer mask; a correction table which stores information indicating, for each mark of the calibration mask measured by the above-described method of measuring inclination of the electron beam, relationship between a voltage applied to the sub-deflector and the at least one of the inclination of the electron beam and the amount of deflection thereof associated with the voltage; a distortion table which stores information on distortion of the transfer mask; and a control device which controls, when the wafer is exposed to the electron beam, the voltage applied to the sub-deflector according to the information stored in the correction and distortion tables, a value for a gap between the wafer and the transfer mask, and a position on the transfer mask scanned by the electron beam, in order to correct the distortion of the transfer mask.

According to the present invention, even if the transfer mask is distorted, the mask pattern can be transferred by exposure to the wafer as precisely as in the case with an undistorted mask.

The present invention is also directed to an electron beam proximity exposure apparatus which transfers a mask pattern formed on a transfer mask to a resist layer on a wafer, the electron beam proximity exposure apparatus comprising: an electron gun that emits an electron beam with a predetermined sectional shape; the transfer mask arranged in proximity to the wafer; a main deflector which controls deflection of the electron beam emitted by the electron gun so that the electron beam scans an entire surface of the transfer mask; a sub-deflector which controls inclination of the electron beam impinging on the transfer mask; a correction table which stores information indicating, for each mark of the calibration mask measured by the above-described method of measuring inclination of the electron beam, relationship between a voltage applied to the sub-deflector and the at least one of the inclination of electron beam and the amount of deflection thereof associated with the voltage; a setting device having expansion and contraction rates of a current wafer in x and y directions set relatively to a same wafer during a predetermined process; and a control device which controls, when the wafer is exposed to the electron beam, the voltage applied to the sub-deflector according to the information stored in the correction table, the expansion and contraction rates of the wafer in the x and y directions set by the setting device, a value for a gap between the wafer and the transfer mask, and a position on the transfer mask scanned by the electron beam, in order to vary a transfer scale in the x and y directions in proportion to the expansion and contraction rates of the wafer in the x and y directions.

According to the present invention, even if expansion or contraction of the wafer varies the ratio of the size of the mask pattern of the mask to the size of the mask pattern transferred to the wafer, the transfer scale can be precisely corrected so that the mask patterns transferred by exposure to the wafer will not locationally deviate from each other.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

Preferred embodiments of methods of measuring and calibrating inclination of electron beams in an electron beam proximity exposure apparatus according to the present invention will be described below with reference to the accompanying drawings.

Figure 1:
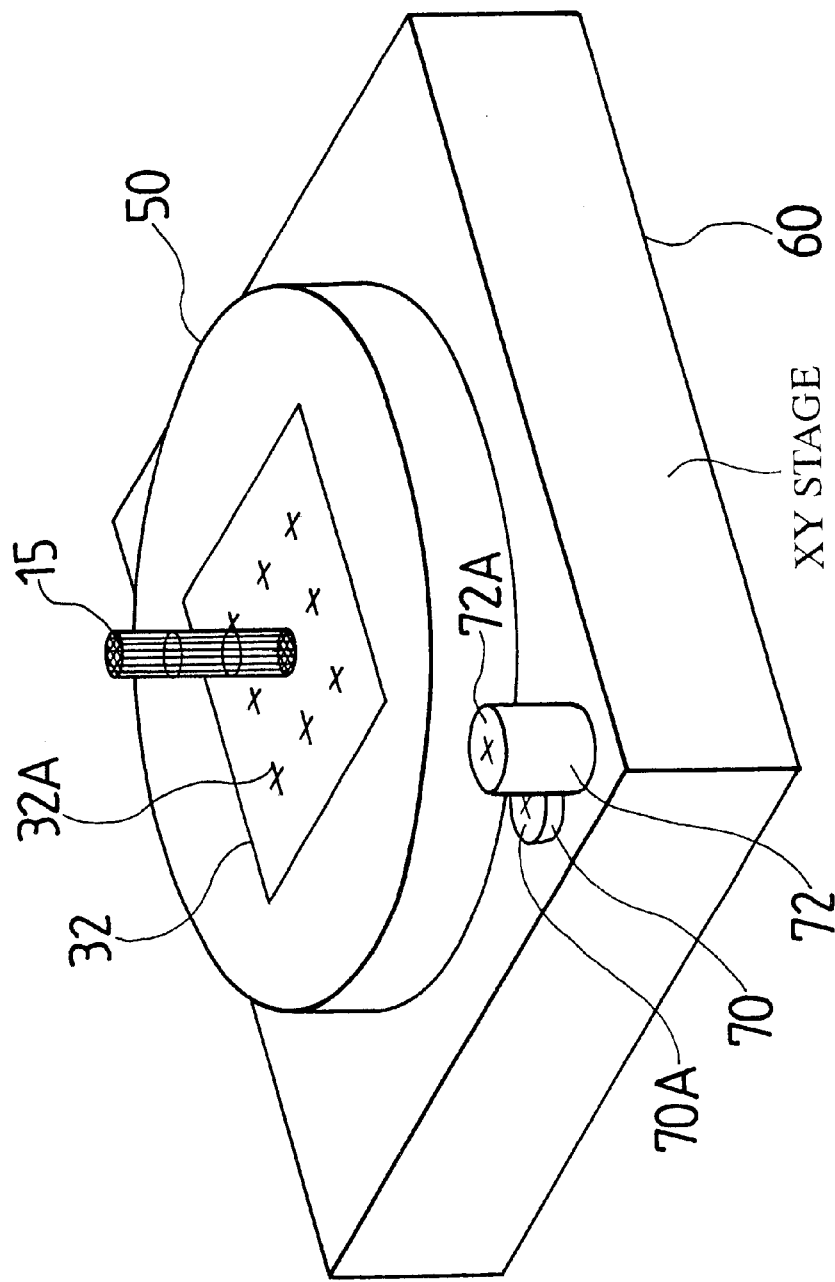
FIG. 1 is a perspective view of an essential part of an electron beam proximity exposure apparatus to which a method according to the present invention is applied.
Figure 2:
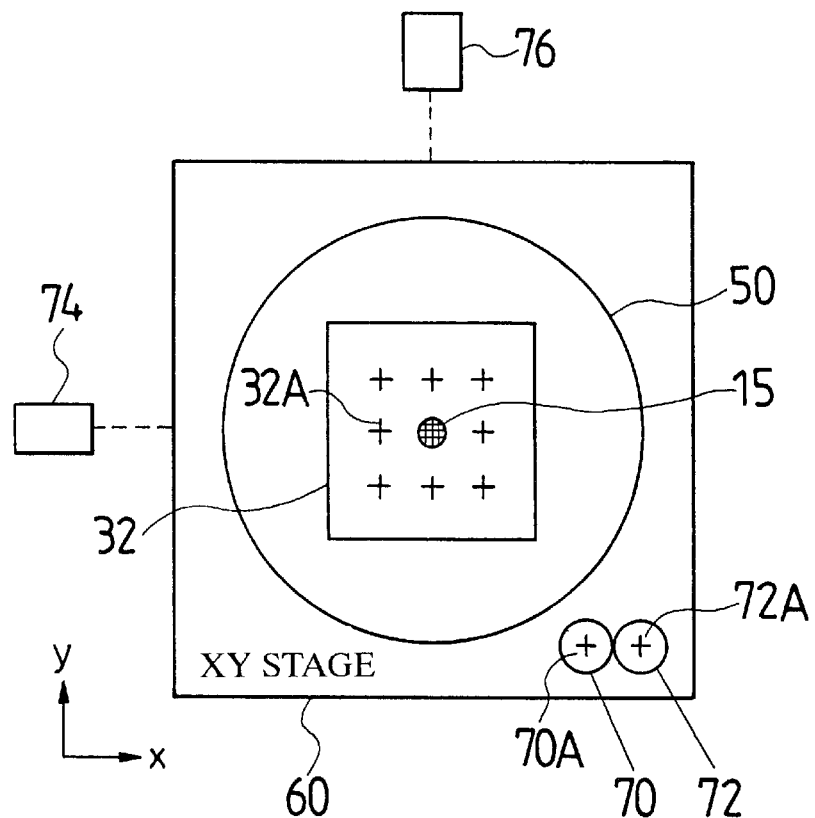
FIG. 2 is a plan view of an essential part of the electron beam proximity exposure apparatus shown in FIG. 1.
Figure 3:
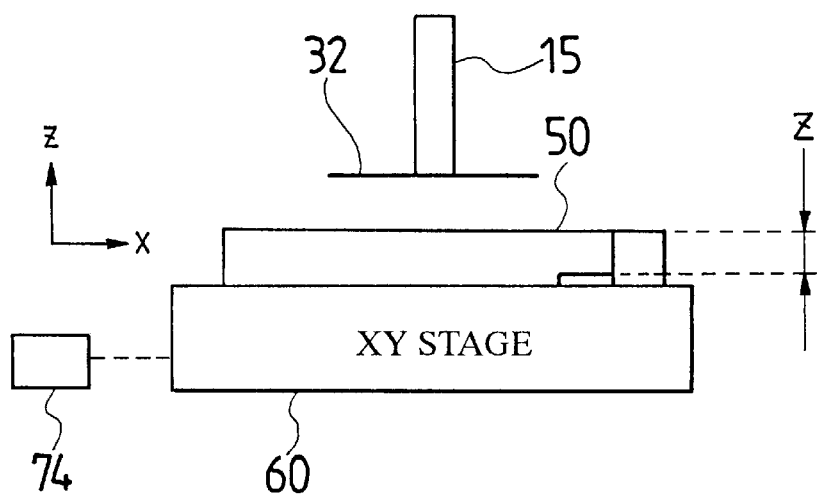
FIG. 3 is a front view of an essential part of the electron beam proximity exposure apparatus shown in FIG. 1.

FIG. 1 is a perspective view of an essential part of an electron beam proximity exposure apparatus to which the method of the present invention is applied. FIGS. 2 and 3 are plan and front views of FIG. 1, respectively.

In these drawings, reference numeral 32 denotes a calibration mask, 70 and 72 are Faraday cups, and 74 and 76 are laser interferometers, which measures the distances that an XY stage 60 has moved in x and y directions. The other parts of the configuration of the electron beam proximity exposure apparatus are similar to those shown in FIG. 11, and thus detailed description thereof will be omitted.

The Faraday cups 70 and 72 have predetermined marks 70A and 72A provided on the respective top surfaces and shaped like openings, and both Faraday cups are disposed on the XY stage 60. Further, the marks 70A and 72A have a difference in height Z therebetween as shown in FIG. 3.

Figure 4:
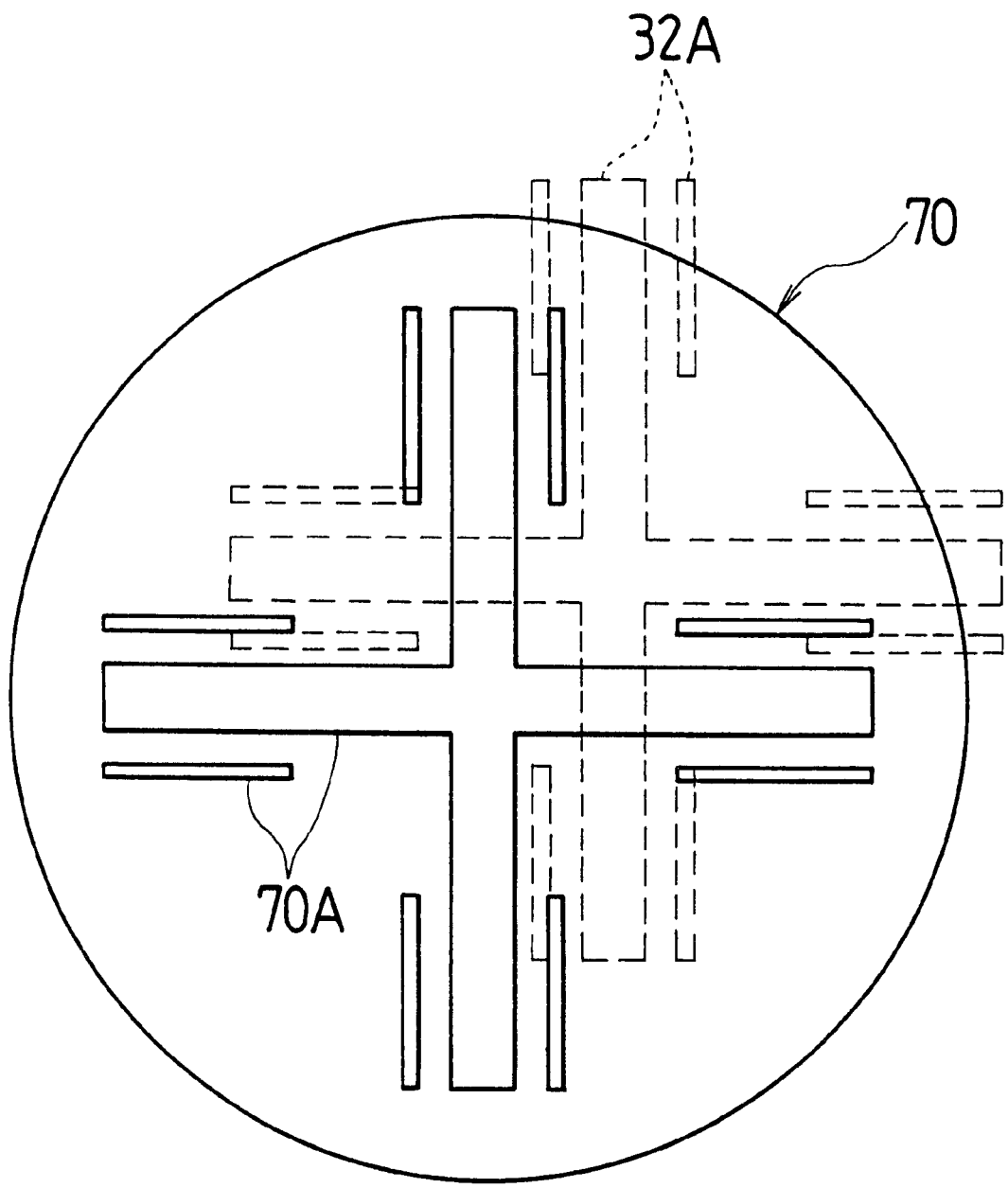
FIG. 4 is an enlarged plan view of Faraday cups in FIG. 1.

FIG. 4 is a plan view of the Faraday cup 70. As shown in this drawing, the mark 70A is composed of a cross slit and eight slits formed along this cross slit. The mark 72A of the Faraday cup 72 has the same shape as the mark 70A.

Figure 11:
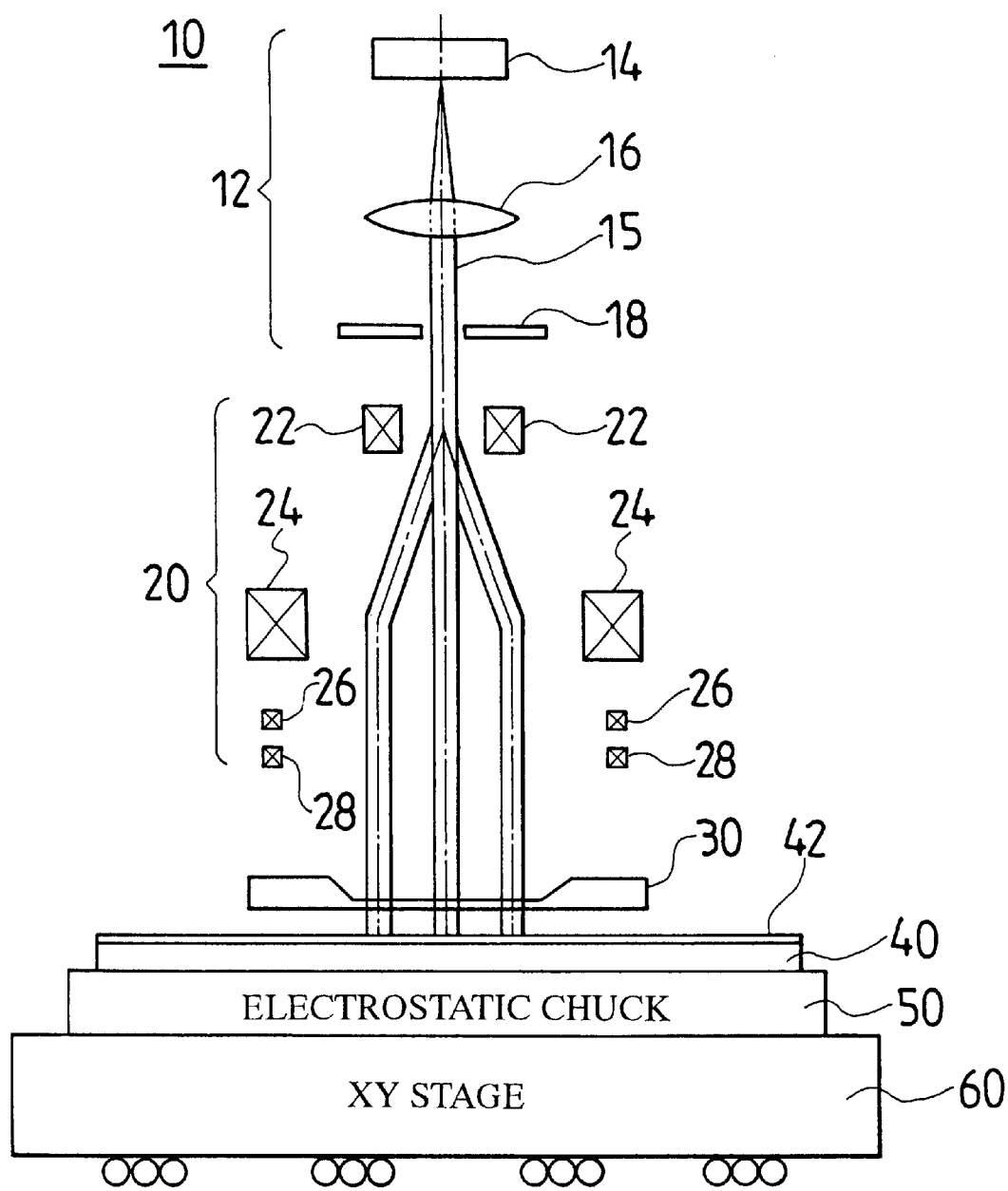
FIG. 11 is a diagram showing a basic configuration of the electron beam proximity exposure apparatus to which the present invention is applied.
Figure 12:
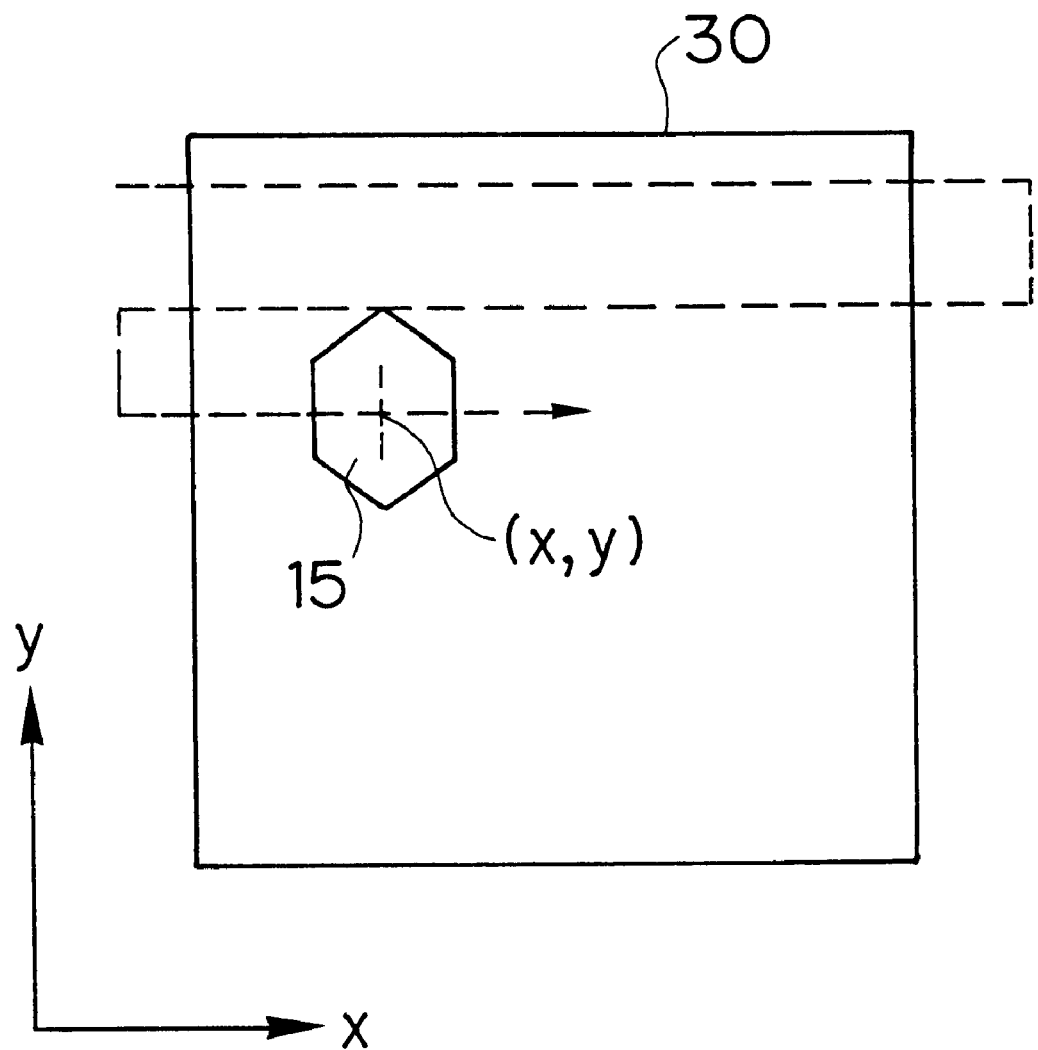
FIG. 12 is a diagram used to describe how electron beams scan a mask.

On the other hand, when the inclination of electron beams is to be measured, the calibration mask 32 is loaded into the electron beam proximity exposure apparatus in place of the mask 30, shown in FIG. 11. The calibration mask 32 has nine marks 32A formed thereon as shown in FIG. 2. These marks 32A have the same opening shape as the mark 70A as shown by a broken line in FIG. 4. Further, the nine marks 32A are formed at predetermined positions on a surface of the mask. That is, the central mark 32A is formed at a position at which its center coincides with the optical axis of the electron gun 12 (see FIG. 11) of the electron beam proximity exposure apparatus when the calibration mask 32 is loaded. The other eight marks are formed at equal intervals in the x and y directions.

The Faraday cups 70 and 72 convert incident electron beams into an electrical quantity (current) to output currents corresponding to the amounts of electron beams incident on the cups through the marks 70A and 72A on the top surface, respectively. Accordingly, the Faraday cup 70 outputs the largest current when the mark 70A and the mark 32A of the calibration mask 32 coincide with each other on the electron beam axis of the electron beams. The shapes of the mark 70A and others are not limited to those in this embodiment, but any shapes can be used as long as the current output from the Faraday cup becomes largest only when the marks of the Faraday cup and calibration mask coincides with each other on the electron beam axis.

First Embodiment

Next, description will be given of a method of measuring the inclination of electron beams by using the Faraday cups 70 and 72 and calibration mask 32.

Figure 5:
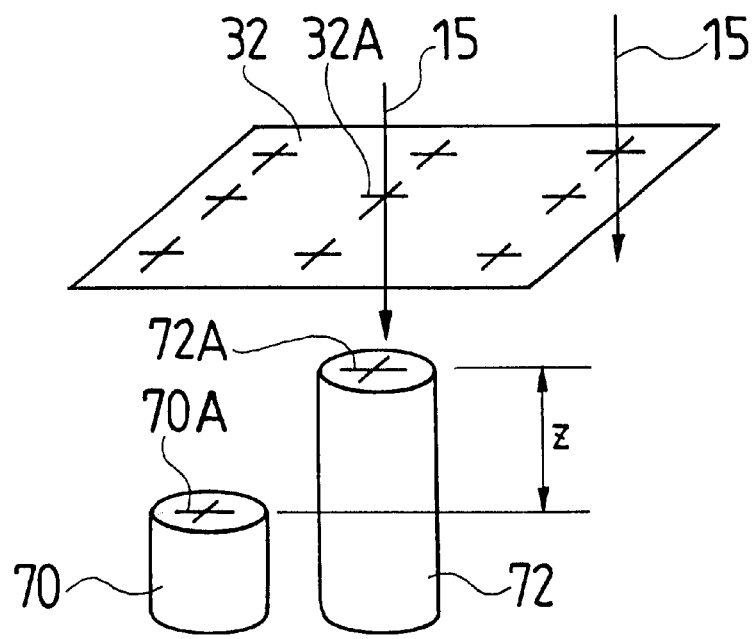
FIG. 5 is a diagram used to describe a method of measuring inclination of electron beams according to the present invention.

(1) First of all, the calibration mask 32 is loaded.
(2) Electron beams 15 are emitted onto the optical axis of the electron gun 12 without being deflected by the main deflectors 22 and 24 and sub-deflectors 26 and 28 (see FIG. 11). At this time, the electron beams 15 are incident on the central mark 32A of the calibration mask 32 as shown in FIGS. 1, 2 and 5.
  (i) The XY stage 60 is moved to move the Faraday cup 70 to just below the electron beams.
  (ii) The XY stage 60 is moved so that the output value of the Faraday cup 70 is largest, and the positional coordinates on the XY stage 60 measured by the laser interferometers 74 and 76 at this time are defined as (x0, y0). As an example of a method of moving the XY stage so that the output value of the Faraday cup 70 is largest, it is contemplated that after the Faraday cup 70 has been moved to just below the electron beams, the electron beams are allowed to scan an area located just below themselves at a constant speed to sample the output value of the Faraday cup 70 and the laser positional coordinates.

(iii) The XY stage 60 is moved to move the Faraday cup 72 to just below the electron beams.

(iv) The XY stage 60 is moved so that the output value of the Faraday cup 70 is largest, and the positional coordinates on the XY stage 60 measured by the laser interferometers 74 and 76 at this time are defined as (x0', y0').

(3) The main deflectors 22 and 24 are used to deflect the electron beams 15 so that the electron beams 15 are incident on another mark of the calibration mask 32 (in FIG. 5, the upper right mark of the calibration mask 32).

(i) The XY stage 60 is moved to move the Faraday cup 70 to just below the electron beams.

(ii) The XY stage 60 is moved so that the output value of the Faraday cup 70 is largest, and the positional coordinates on the XY stage 60 measured by the laser interferometers 74 and 76 at this time are defined as (x1, y1).

(iii) The XY stage 60 is moved to move the Faraday cup 72 to just below the electron beams.

(iv) The XY stage 60 is moved so that the output value of the Faraday cup 70 is largest, and the positional coordinates on the XY stage 60 measured by the laser interferometers 74 and 76 at this time are defined as (x1', y1').

(4) The inclination angle of the electron beams 15 deflected so as to impinge on another mark of the calibration mask 32 is calculated according to the coordinates (x0, y0), (x0', y0'), (x1, y1), and (x1', y1') of the position of the XY stage 60 measured in (2)(ii) and (2)(iv) and (3)(ii) and (3)(iv), using the following Equations (1) and (2):

$$T \approx (Lx - Lx')/Z \quad (1)$$

where Lx=x1−x0, Lx'=x1−X0' and Z is a difference in height between the mark 70A and the mark 72A; and $$U \approx (Ly - Ly')/Z \quad (2)$$

where Ly=y1−y0, Ly'=y1'−y0'.

Figure 6:
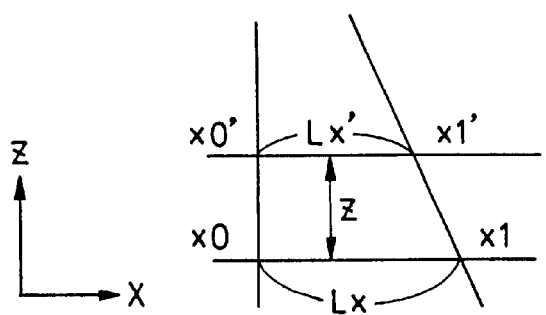
FIG. 6 is a diagram used to describe the method of measuring inclination of electron beams according to the present invention.

FIG. 6 shows a positional relationship between the coordinates, which is used to determine the inclination angle T, shown in Equation (1). The inclination angles T and U are small enough to be approximated by Equations (1) and (2).

The inclination angles T and U of the electron beams are calculated for each mark 32A of the calibration mask 32 (for each position scanned by the electron beams) as described above. If the inclination angle of the electron beams is accurately measured (for example, 0.01 mrad), when the difference in height Z between the marks 70A and 72A is assumed to be 20 mm, then the accuracy with which the position is detected using the Faraday cups 70 and 72 and laser interferometers 74 and 76 may be about 0.72 μm.

Further, if the positional difference between the marks 70A and 72A on the xy plane is measured in advance, the steps (1)(i) to (1)(iv) can be omitted.

That is, Equations (1) and (2) can be rewritten as follows:

$$T \approx (Lx - Lx')/Z \quad (1')$$
$$\approx \{(x1 - x0) - (x1' - x0')\}/Z$$
$$\approx \{(x1 - x1') - (x0 - x0')\}/Z, \text{ and}$$

$$U \approx (Ly - Ly')/Z \quad (2')$$
$$\approx \{(y1 - y0) - (y1' - y0')\}/Z$$
$$\approx \{(y1 - y1') - (y0 - y0')\}/Z$$

When the amounts of positional difference between the marks 70A and 72A of the Faraday cups 70 and 72, respectively, previously measured on the xy plane are defined as (ΔLx, ΔLy), the amount of positional difference ΔLx can be applied to Equation (1') instead of (x0−x0'), and the amount of positional difference ΔLy can be applied to Equation (2') instead of (y0−y0').

Then, a correction table is created which stores voltages applied to the main deflectors in order to zero the inclination angles T and U or U and T of the electron beams for each position scanned thereby, which have been calculated as described above. The inclination angle of the electron beams at an arbitrary scanned position on the mask can be determined by interpolation based on the inclination angles of the electron beams for a plurality of marks around this scanned position.

Subsequently, when the main deflectors 22 and 24 control deflection of the electron beams 15 to scan and expose the entire surface of a transfer mask to the electron beams in order to transfer the mask pattern to the wafer, which is located in proximity to the mask, the inclination correction value corresponding to the position scanned by the electron beams is read out from the inclination correction table. Then, according to this inclination correction value, the main deflectors 22 and 24 are controlled so as to zero the inclination of the electron beams.

This causes the electron beams 15 to scan the transfer mask while always remaining parallel with the optical axis regardless of the scanned position on the mask.

Second Embodiment

Now, description will be given of a method of determining a relationship between a voltage applied to the sub-deflectors 26 and 28 and the inclination of electron beams 15 incident on the mask or the amount of deflection thereof, by using the Faraday cups 70 and 72 and calibration mask 32 as described above.

(i) As described above in (3), the coordinates (x1, y1) of the position of the XY stage 60 are measured when the main deflectors 22 and 24 deflect the electron beams 15 so that the electron beams 15 impinge on the mark of the calibration mask 32 and on the mark 70A of the Faraday cup 70 (see (3)(ii)). Subsequently, a predetermined voltage (dVx, dVy) is applied to the sub-deflectors 26 and 28 to incline the electron beams 15 through a small angle.

(ii) The XY stage 60 is moved so that the output value of the Faraday cup 70 is largest, and the positional coordinates on the XY stage 60 measured by the laser interferometers 74 and 76 at this time are defined as (x1d, y1d).

(iii) In the same way as (i), the coordinates (x1', y1') of the position of the XY stage 60 are measured when the main deflectors 22 and 24 deflect the electron beams 15 so that the electron beams 15 impinge on the mark of the calibration mask 32 and on the mark 72A of the Faraday cup 72 (see (3)(iii)). Subsequently, the voltage (dVx, dVy) is applied to the sub-deflectors 26 and 28 to incline the electron beams 15 through the small angle.

(iv) The XY stage 60 is moved so that the output value of the Faraday cup 70 is largest, and the positional coordinates on the XY stage 60 measured by the laser interferometers 74 and 76 at this time are defined as (x1'd, y1'd).

(v) The inclination angles (dT, dU) of the electron beams 15 measured when the voltage (dVx, dVy) is applied to the sub-deflectors 26 and 28 are calculated according to the measured coordinates (x1, y1), (x1', y1'), (x1d, y1d), and (x1'd, y1'd) of the position of the XY stage 60, using the following Equations (3) and (4):

$$dT \approx (dLx - dLx')/Z, \quad (3)$$

where dLx=dx1−x1, dLx'=dx1'−X1'; and $$dU \approx (dLy - dLy')/Z \quad (4)$$

where dLy=dy1−y1, dLy'=dy1'−y1'.

As described above, the voltage (dVx, dVy) applied to the sub-deflectors 26 and 28 and the inclination angles dT and dU of the electron beams associated with the applied voltage are calculated for each mark 32A of the calibration mask 32 (for each position scanned by the electron beams).

Further, the gain (Gx, Gy) shown in the following Equations (5) and (6) may be determined in place of the inclination angles (dT, dU), determined using Equation (3) or (4).

$$Gx = (dLx - dLx')/dVx, \quad (5)$$

where dLx=dx1−x1, dLx'=dx1'−x1'; and $$Gy = (dLy - dLy')/dVy. \quad (6)$$

The gain (Gx, Gy) shown in Equations (5) and (6) represents the ratio of the predetermined voltage (dVx, dVy), applied to the sub-deflectors 26 and 28, to the amount of deflection of the electron beams occurring upon application of the voltage (dVx, dvy) owing to the difference Z in height.

Figure 7:
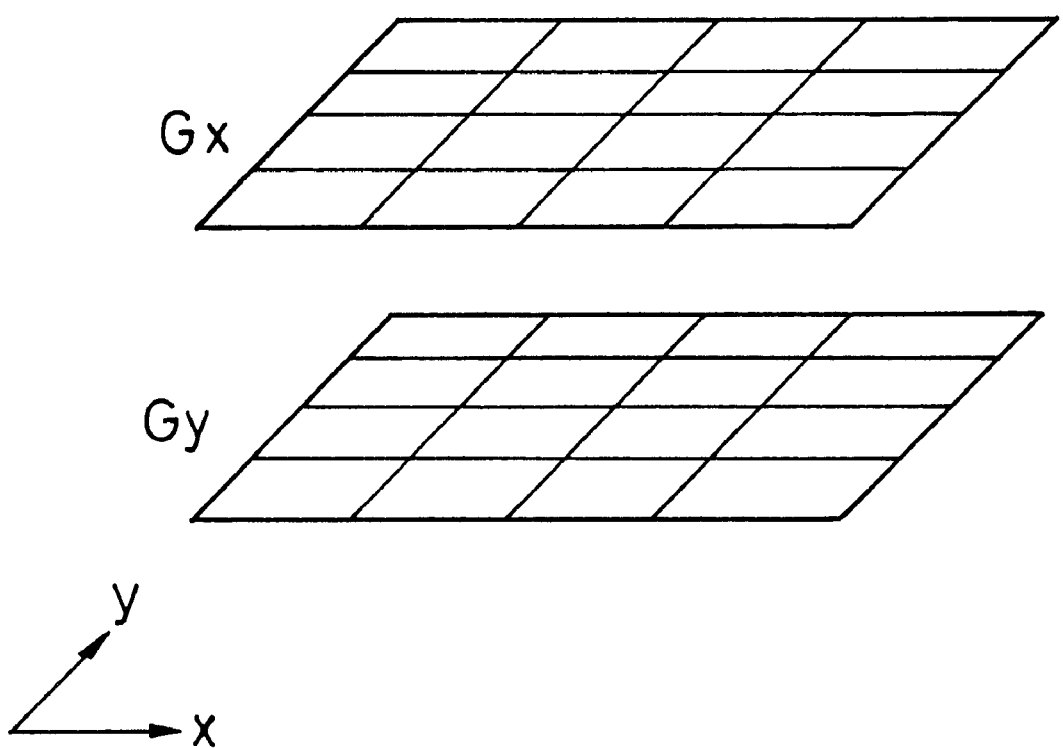
FIG. 7 is a diagram showing a gain table for use in a method of calibrating inclination of electron beams according to the present invention.

Now, if a calibration mask with 5×5 marks is used, a gain table such as the one shown in FIG. 7 is created by measuring the above gain for each mark in the main deflecting area (25 marks in total). The gain at an arbitrary xy position is expressed by a tertiary polynomial with variables x and y.

Figure 13:
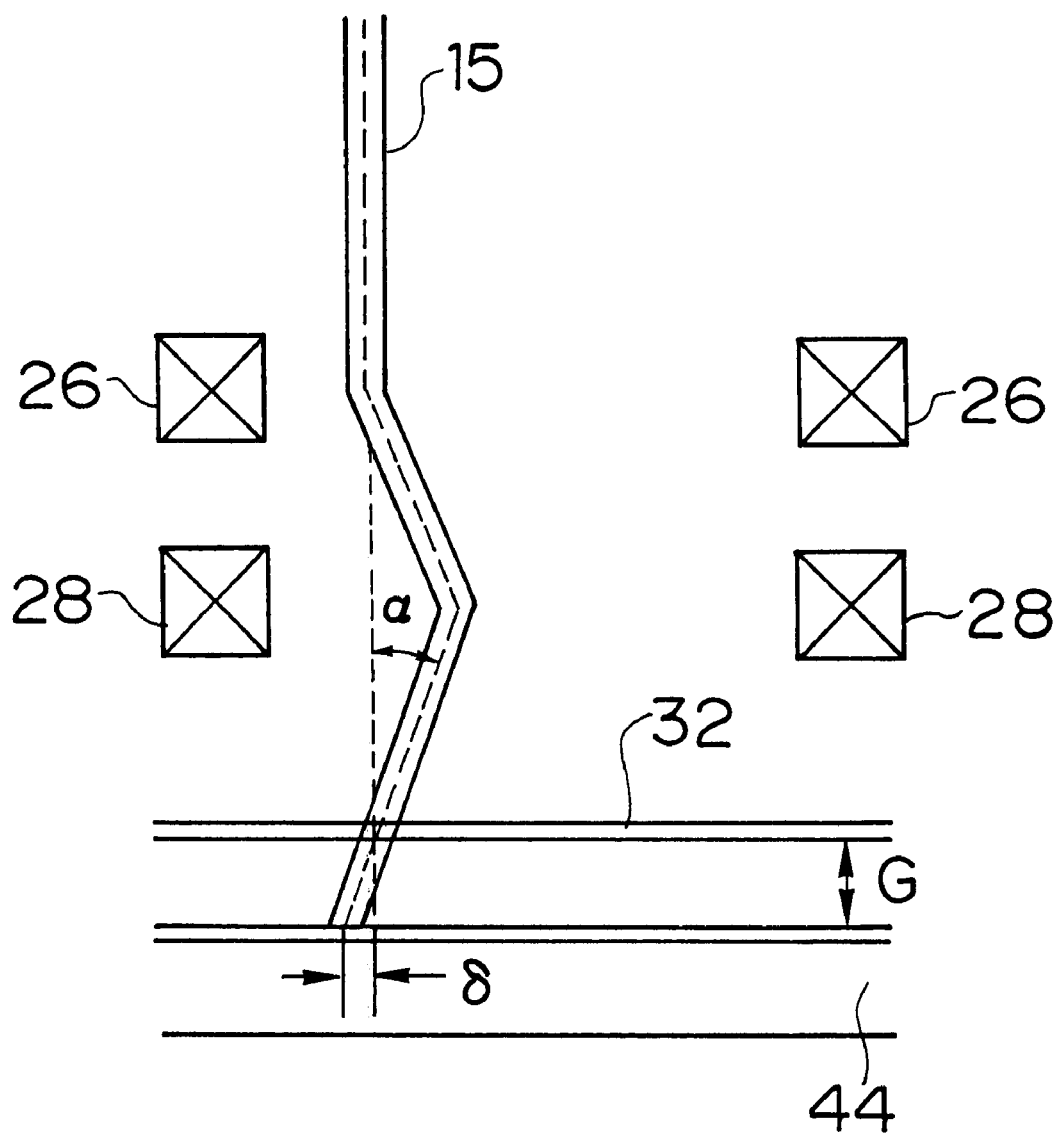
FIG. 13 is a diagram showing how sub-deflectors control inclination of electron beams.

Consequently, if the gap G between the mask 30 and the wafer 40 and the amount δ of deflection to be corrected are known as shown in FIG. 13, the voltage applied to the sub-deflectors 26 and 28 can be controlled according to the gain (Gx, Gy) in the gain table in FIG. 7 so as to deflect the electron beams by the amount δ.

In this respect, normal two-staged deflectors deflect an irradiation position by shifting electron beams. In this case, a deflected position x' resulting from an input x is expressed by the following Equation (7):

$$x' = x + (A + Bx + Cx^2 + \dots), \quad (7)$$

where A denotes a shift error and B denotes a gain error. The sub-deflectors 26 and 28 according to the present invention deflect the irradiation position by inclining the electron beams instead of shifting them and by a small amount. Thus, the shift error A in Equation (7) and errors in quadratic or higher items are negligible. Therefore, the sub-deflection calibration is achieved by reducing B (B→0). If the notation is slightly changed to define x' as Gx (G denotes a gain coefficient), then the object of the calibration is to set G at 1.

Next, description will be given of the control of the voltage applied to the sub-deflectors 26 and 28 according to the gain (Gx, Gy) in the gain table in FIG. 7.

Figure 10:
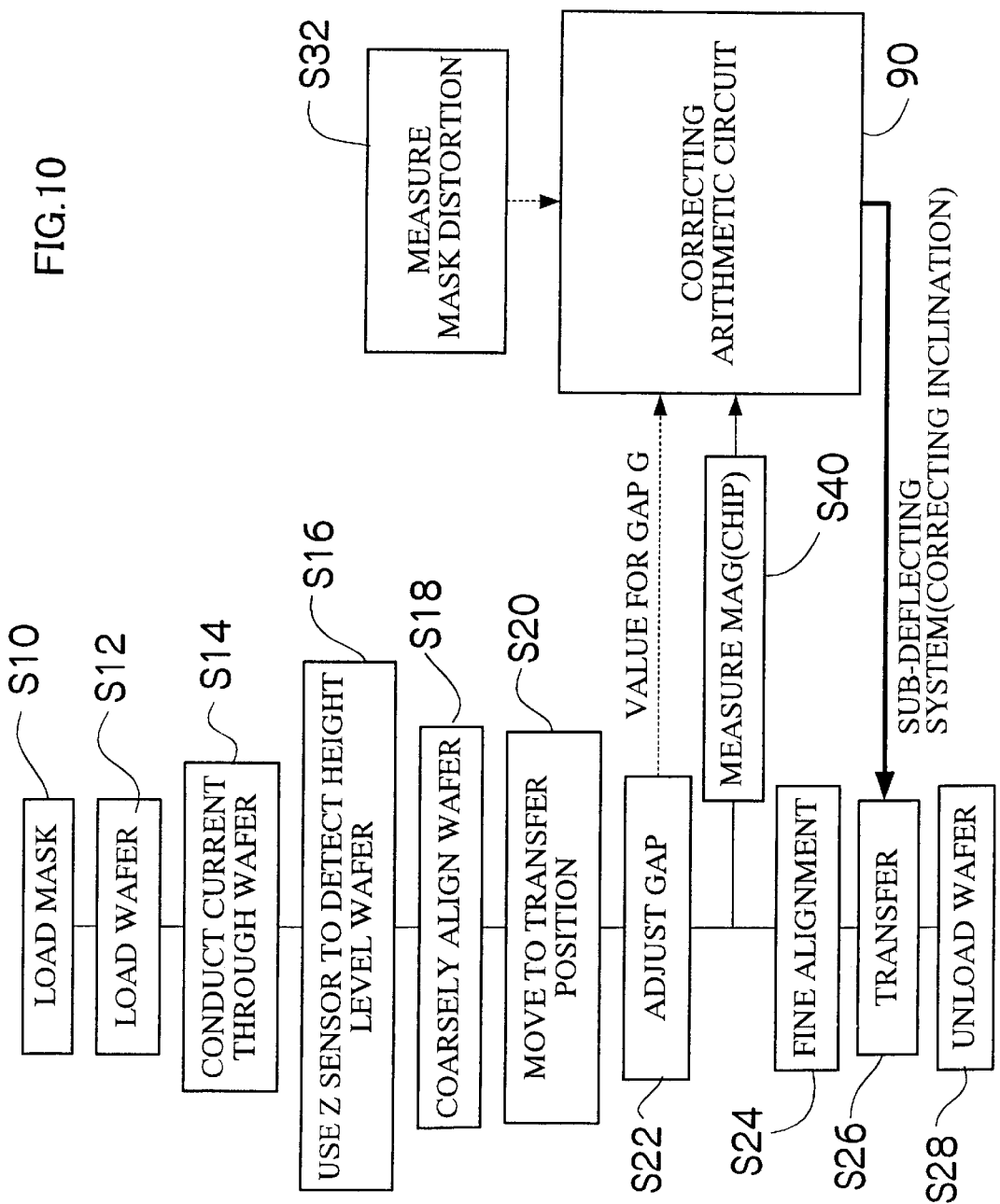
FIG. 10 is a flow chart showing an operation procedure of using the electron beam proximity exposure apparatus according to the present invention to expose a mask pattern to electron beams to transfer the pattern to a wafer.

FIG. 10 is a flow chart showing an operation procedure of using the electron beam proximity exposure apparatus according to the present invention to expose the mask pattern of the transfer mask to electron beams to transfer the pattern to the wafer.

As shown in this drawing, first of all, the transfer mask is loaded into the electron beam proximity exposure apparatus (step S10). Subsequently, the wafer is positioned on the electrostatic chuck 50 on the XY stage 60 and then attracted and fixed to the electrostatic chuck 50 for loading (step S12). Subsequently, conductive pins or the like are used to conduct current through the wafer so that the wafer is not charged with electrons (step S14).

Next, a z sensor detects the height of the wafer, and the height is then adjusted (step S16). Then, the wafer is coarsely aligned (coarse alignment) (step S18).

Subsequently, the expansion and contraction rates of the wafer in the x and y directions are measured (MAG measurements (global)) (step S30), and a signal indicative of the measured expansion and contraction rate is output to a correcting arithmetic circuit 106A. The expansion and contraction rate of the wafer, as used herein, refers to the expansion and contraction of the current wafer measured with reference to the same wafer during a predetermined process including the preceding transfer process. Subsequently, the wafer is moved to a transfer position (step S20).

Then, the gap between the mask and the wafer is measured and adjusted (step S22). A method of measuring the gap G between the mask and the wafer is disclosed in Japanese Patent Application Publication No. 2000-356511 in detail, but the present invention is not limited to this measurement method.

The gap G, measured as described above, is adjusted to have a predetermined value (for example, 50 μm). The value for the gap G (gap value) is added to the correcting arithmetic circuit 90 in order to control the deflection carried out by the sub-deflectors 26 and 28.

Subsequently, the mask and a chip on the wafer are finely aligned with each other (fine alignment) (step S24), and the mask pattern is transferred to the wafer using electron beams 8 step S26).

During the transfer, the correcting arithmetic circuit 90 determines the amount of deflection of the electron beams on the wafer according to the position scanned by the electron beams and according to the expansion and contraction rates of the wafer. In this respect, the transfer scale can be slightly varied by continuously varying the amount of deflection of the electron beams on the wafer according to the position scanned by the electron beams.

After finding the amount of deflection of the electron beams on the wafer, the correcting arithmetic circuit 90 determines the voltage applied to the sub-deflectors 26 and 28 according to the position on the transfer mask scanned by the electron beams and according to gain (Gx, Gy) in the gain table shown in FIG. 7 and the gap G between the mask and the wafer. Then, the correcting arithmetic circuit 90 applies the determined voltage to the sub-deflectors 26 and 28. This allows the transfer scale to be varied depending on the expansion and contraction rates of the wafer.

Figure 14A:
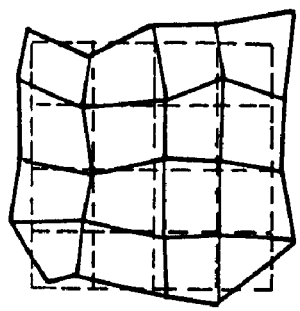
FIGS. 14(A) and 14(B) are diagrams used to describe how to correct a distorted mask.
Figure 14B:
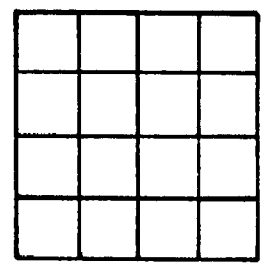

Further, the correcting arithmetic circuit 90 has already received in S32 previously measured data indicative of a mask distortion. Thus, if the correcting arithmetic circuit 90 receives an input mask distortion such as the one shown in FIG. 14(A), it determines the amount of deflection required to correct this mask distortion and controls the voltage applied to the sub-deflectors 26 and 28 as described above so that the mask pattern is transferred without any mask distortion as shown in FIG. 14(B).

Once the mask pattern has been completely transferred to the wafer as described above, the wafer is unloaded (step S28). The correcting arithmetic circuit 90 may carry out one or both of the control of the transfer scale and the correction of mask distortion.

Third Embodiment

Next, description will be given of a simple method of controlling deflection of the electron beams 15 to correct the inclination of the electron beams 15 so that when scanning the entire surface of the mask, the electron beams 15 are perpendicularly incident on the mask.

Figure 8:
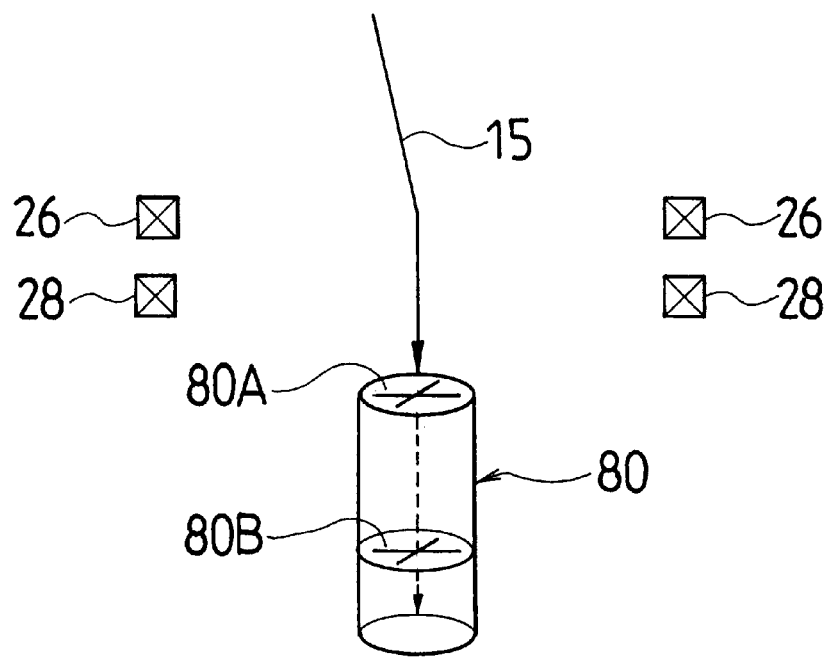
FIG. 8 is a diagram used to describe the method of calibrating inclination of electron beams according to the present invention.

First, a Faraday cup 80 having two marks 80A and 80B is provided as shown in FIG. 8, and is installed on the XY stage 60. The two marks 80A and 80B are assumed to be arranged coaxially and parallel with the optical axis of the electron gun 12 when the Faraday cup 80 is installed on the XY stage 60.

Figure 9:
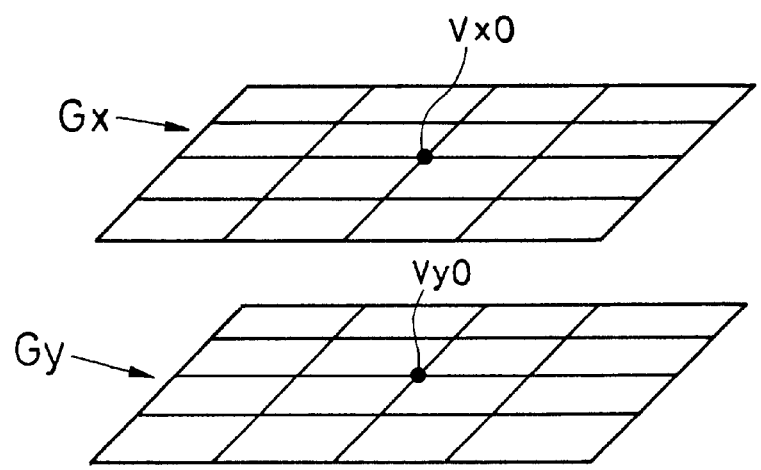
FIG. 9 is a diagram showing a correction table for use in the method of calibrating inclination of electron beams according to the present invention.

(1) Electron beams 15 are emitted onto the optical axis of the electron gun 12.
(2) Faraday cup 80 is moved onto the optical axis.
(3) The sub-deflectors 26 and 28 are used to cause the electron beams 15 to scan the mask. The voltage applied to the sub-deflectors 26 and 28 when the output value of the Faraday cup 80 is largest is stored as an inclination correction value (Vx0, V0). When the output value of the Faraday cup 80 is largest, the electron beams 15 are perpendicular to the mask, or this state is defined as being perpendicular.
(4) The electron beams 15 are deflected to each scanned position in the main deflecting area (for example, four scanned positions in the corners or 24 scanned positions) in the same manner as in (1) to (3). An inclination correction value is found for each scanned position to create a correction table such as the one shown in FIG. 9. In this respect, FIG. 9 shows a correction table having correction values for 25 scanned positions including the correction value (Vx0, V0) for the optical axis.

Accordingly, when the main deflectors 22 and 24 control deflection of the electron beams 15 so that the electron beams scan the entire surface of the mask, the electron beams can be corrected so as to be parallel with the optical axis regardless of the position scanned by the electron beams 15, by reading out the corresponding correction value from the correction table according to the position scanned by the electron beams 15 and applying the voltage corresponding to the correction value to the sub-deflectors 26 and 28.

In the above-described embodiments, the Faraday cups are used, which convert electron beams into a current corresponding to the amount of incident beams. However, the present invention is not limited to this aspect, but any electron beam detecting device may be used as long as it can convert electron beams into an electrical quantity corresponding to the amount of incident beams.

As described above, according to the present invention, the inclination of electron beams can be accurately measured by using an electron beam detecting device with marks located at different heights. Further, calibration can be achieved such that when electron beams scan the entire surface of the mask, they remain parallel with the optical axis. The present invention further enables determination of the relationship between the voltage applied to the sub-deflectors and the angle at which electron beams are incident on the mask pattern or the amount of deflection of the electron beams. This enables precise determination of the voltage applied to the sub-deflectors at the time of correcting mask distortion or changing the transfer scale.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of measuring inclination of an electron beam in an electron beam proximity exposure apparatus which transfers a mask pattern formed on a mask to a resist layer on a wafer, wherein the electron beam proximity exposure apparatus comprises:
an electron gun that emits the electron beam with a predetermined sectional shape;
the mask arranged in proximity to the wafer;
a deflector that controls deflection of the electron beam emitted by the electron gun so that the electron beam scans an entire surface of the mask;
a calibration mask having a plurality of marks previously formed thereon;
a first electron beam detecting device which has a first mark and which converts the electron beam passing through the first mark into an electrical quantity;
a second electron beam detecting device which has a second mark located above the first mark and below the calibration mask and which converts the electron beam passing through the second mark into an electrical quantity; and
a moving device which moves the first and second electron beam detecting devices on an xy plane which is orthogonal to an optical axis of the electron beam, the method comprising the steps of:
(a) loading the calibration mask and using the deflector to control deflection of the electron beam so that the electron beam impinges on an arbitrary mark of the calibration mask;
(b) detecting a position of the first electron beam detecting device after movement when the electron beam, having passed through the mark of the calibration mask, passes through a first mark of the first electron beam detecting device to make the electrical quantity detected by the first electron beam detecting device largest;
(c) detecting a position of the second electron beam detecting device after movement when the electron beam, having passed through the mark of the calibration mask, passes through a second mark of the second electron beam detecting device to make the electrical quantity detected by the second electron beam detecting device largest;
(d) calculating the inclination of the electron beam observed when the electron beam is deflected so as to impinge on the arbitrary mark of the calibration mask according to positions of the first electron beam detecting device in x and y directions after movement, the positions being detected in the step (b), positions of the second electron beam detecting device in the x and y directions after movement, the positions being detected in the step (c), the amounts of positional difference between the first and second marks in the x and y directions, and a difference in height between the first and second marks; and
(e) repeating the steps (a) to (d) for each mark of the calibration mask to determine the inclination of the incident electron beam for each mark.

2. The method as defined in claim 1, wherein the amounts of positional difference between the first and second marks in the x and y directions are determined by:
allowing the electron beam to impinge on a mark of the calibration mask located on an optical axis of the electron gun without deflecting the electron beam using the deflector;
detecting the position of the first electron beam detecting device after movement when the electron beam, having passed through the mark of the calibration mask, passes through the first mark of the first electron beam detecting device to make the electrical quantity detected by the first electron beam detecting device largest;
detecting the position of the second electron beam detecting device after movement when the electron beam, having passed through the mark of the calibration mask, passes through the second mark of the second electron beam detecting device to make the electrical quantity detected by the second electron beam detecting device largest; and
determining the amount of deviation according to the detected position of the first electron beam detecting device in the x and y directions and the detected position of the second electron beam detecting device in the x and y directions.

3. A method of calibrating inclination of an electron beam in an electron beam proximity exposure apparatus, the method comprising the steps of:
determining an inclination correction value for each mark formed on the calibration mask, the inclination correction value being used to zero the inclination of the electron beam determined by the method of measuring inclination of the electron beam in the electron beam proximity exposure apparatus according to claim 1;
creating an inclination correction table that stores correction values correspondingly to a position scanned by the electron beam;
when the deflector is used to control deflection of the electron beam emitted by the electron gun so that the electron beam scans the entire surface of the mask, reading out a corresponding inclination correction value from the inclination correction table according to the position scanned by the electron beam and controlling the deflector according to the readout inclination correction value; and
calibrating the electron beam so that the electron beam is parallel with the optical axis regardless of the position scanned by the electron beam.

4. A method of calibrating inclination of an electron beam in an electron beam proximity exposure apparatus which transfers a mask pattern formed on a mask to a resist layer on a wafer,
wherein the electron beam proximity exposure apparatus comprises:
an electron gun that emits the electron beam with a predetermined sectional shape;
the mask arranged in proximity to the wafer;
a main deflector which controls deflection of the electron beam emitted by the electron gun so that the electron beam scans an entire surface of the mask;
a sub-deflector which controls the inclination of the electron beam impinging on the mask;
an electron beam detecting device which has two marks arranged on an axis which is parallel with an optical axis of the electron gun, the marks being located at different heights, the electron beam detecting device converting the electron beam passing through the two marks into an electrical quantity; and
a moving device which moves the electron beam detecting device to an arbitrary position scanned by the electron beam,
the method comprising the steps of:
(a) moving the electron beam detecting device to the arbitrary position scanned by the electron beam and using the main deflector to deflect the electron beam so that the electron beam impinges on the electron beam detecting device;
(b) varying the inclination of the electron beam using a voltage applied to the sub-deflector and detecting the voltage applied when the electrical quantity detected by the electron beam detecting device is largest;
(c) executing the steps (a) and (b) by varying the position of the electron beam detecting device and creating a correction table that stores the voltage applied to the sub-defector correspondingly to the position scanned by the electron beam; and
(d) when the main deflector is used to control deflection of the electron beam emitted by the electron gun so that the electron beam scans the entire surface of the mask, reading out a corresponding voltage from the inclination correction table according to the position scanned by the electron beam, and applying the voltage to the sub-deflector,
wherein calibration is executed so that the electron beam is parallel with the optical axis regardless of the position scanned by the electron beam.

5. A method of measuring inclination of an electron beam in an electron beam proximity exposure apparatus which transfers a mask pattern formed on a mask to a resist layer on a wafer,
wherein the electron beam proximity exposure apparatus comprises:
an electron gun that emits the electron beam with a predetermined sectional shape;
the mask arranged in proximity to the wafer;
a main deflector which controls deflection of the electron beam emitted by the electron gun so that the electron beam scans an entire surface of the mask;
a sub-deflector which controls the inclination of the electron beam impinging on the mask;
a calibration mask having a plurality of marks previously formed thereon;
a first electron beam detecting device which has a first mark and which converts the electron beam passing through the first mark into an electrical quantity;
a second electron beam detecting device which has a second mark located above the first mark and below the calibration mask and which converts the electron beam passing through the second mark into an electrical quantity; and
a moving device which moves the first and second electron beam detecting devices on an xy plane which is orthogonal to an optical axis of the electron beam,
the method comprising the steps of:
(a) loading the calibration mask and using the main deflector to control deflection of the electron beam so that the electron beam impinges on an arbitrary mark of the calibration mask;
(b) applying a predetermined voltage to the sub-deflector to incline the electron beam;
(c) detecting a position of the first electron beam detecting device after movement when the electron beam, having passed through the mark of the calibration mask, passes through the first mark of the first electron beam detecting device to make the electrical quantity detected by the first electron beam detecting device largest;

(d) detecting a position of the second electron beam detecting device after movement when the electron beam, having passed through the mark of the calibration mask, passes through the second mark of the second electron beam detecting device to make the electrical quantity detected by the second electron beam detecting device largest;

(e) using the main deflector to deflect the electron beam so that the electron beam impinges on the arbitrary mark of the calibration mask, according to positions of the first electron beam detecting device in x and y directions after movement, the positions being detected in the step (c), positions of the second electron beam detecting device in the x and y directions after movement, the positions being detected in the step (d), and the amounts of positional difference between the first and second marks in the x and y directions, and calculating at least one of the inclination of the electron beam and the amount of deflection thereof observed when a predetermined voltage is applied to the sub-deflector; and (f) repeating the steps (a) to (d) for each mark of the calibration mask to determine for each mark relationship between the voltage applied to the sub-deflector and the at least one of the inclination of the electron beam and the amount of deflection thereof associated with the voltage.

6. An electron beam proximity exposure apparatus which transfers a mask pattern formed on a transfer mask to a resist layer on a wafer, the electron beam proximity exposure apparatus comprising:

an electron gun that emits an electron beam with a predetermined sectional shape;

the transfer mask arranged in proximity to the wafer;

a main deflector which controls deflection of the electron beam emitted by the electron gun so that the electron beam scans an entire surface of the transfer mask;

a sub-deflector which controls inclination of the electron beam impinging on the transfer mask;

a correction table which stores information indicating, for each mark of the calibration mask measured by the method of measuring inclination of the electron beam according to claim 5, relationship between a voltage applied to the sub-deflector and the at least one of the inclination of the electron beam and the amount of deflection thereof associated with the voltage;

a distortion table which stores information on distortion of the transfer mask; and a control device which controls, when the wafer is exposed to the electron beam, the voltage applied to the sub-deflector according to the information stored in the correction and distortion tables, a value for a gap between the wafer and the transfer mask, and a position on the transfer mask scanned by the electron beam, in order to correct the distortion of the transfer mask.

7. An electron beam proximity exposure apparatus which transfers a mask pattern formed on a transfer mask to a resist layer on a wafer, the electron beam proximity exposure apparatus comprising:

an electron gun that emits an electron beam with a predetermined sectional shape;

the transfer mask arranged in proximity to the wafer;

a main deflector which controls deflection of the electron beam emitted by the electron gun so that the electron beam scans an entire surface of the transfer mask;

a sub-deflector which controls inclination of the electron beam impinging on the transfer mask;

a correction table which stores information indicating, for each mark of the calibration mask measured by the method of measuring inclination of the electron beam according to claim 5, relationship between a voltage applied to the sub-deflector and the at least one of the inclination of electron beam and the amount of deflection thereof associated with the voltage;

a setting device having expansion and contraction rates of a current wafer in x and y directions set relatively to a same wafer during a predetermined process; and a control device which controls, when the wafer is exposed to the electron beam, the voltage applied to the sub-deflector according to the information stored in the correction table, the expansion and contraction rates of the wafer in the x and y directions set by the setting device, a value for a gap between the wafer and the transfer mask, and a position on the transfer mask scanned by the electron beam, in order to vary a transfer scale in the x and y directions in proportion to the expansion and contraction rates of the wafer in the x and y directions.

* * * * *